United States Patent
Mao et al.

(10) Patent No.: US 8,003,165 B2
(45) Date of Patent: Aug. 23, 2011

(54) CATALYST FOR CARBON NANOTUBE GROWTH

(75) Inventors: Dongsheng Mao, Austin, TX (US); Yunjun Li, Austin, TX (US); Richard Fink, Austin, TX (US); Valerie Ginsberg, Austin, TX (US); Mohshi Yang, Austin, TX (US); Leif Thuesen, Austin, TX (US)

(73) Assignee: Applied Nanotech Holdings, Inc., Austin, TX (US)

( * ) Notice: Subject to any disclaimer, the term of this patent is extended or adjusted under 35 U.S.C. 154(b) by 1762 days.

(21) Appl. No.: 10/946,640

(22) Filed: Sep. 21, 2004

(65) Prior Publication Data

US 2005/0042369 A1 Feb. 24, 2005

Related U.S. Application Data

(60) Division of application No. 10/223,815, filed on Aug. 20, 2002, now Pat. No. 6,897,603, and a continuation-in-part of application No. PCT/US02/26725, filed on Aug. 22, 2002.

(60) Provisional application No. 60/314,870, filed on Aug. 24, 2001, provisional application No. 60/336,351, filed on Nov. 2, 2001.

(51) Int. Cl.
*B05D 1/12* (2006.01)
(52) U.S. Cl. ............... 427/180; 427/249.1; 427/282; 427/300; 427/304; 427/305
(58) Field of Classification Search .......... 427/180, 427/249.1, 282, 300, 304, 305
See application file for complete search history.

(56) References Cited

U.S. PATENT DOCUMENTS

| 3,866,077 | A | | 2/1975 | Baker et al. |
| 4,272,699 | A | | 6/1981 | Faubel et al. |
| 4,650,691 | A | * | 3/1987 | Kinoshita et al. ............ 427/8 |
| 4,728,851 | A | | 3/1988 | Lambe |
| 4,894,293 | A | * | 1/1990 | Breit et al. ............ 428/614 |
| 5,453,297 | A | | 9/1995 | Dye et al. |
| 5,773,921 | A | | 6/1998 | Keesmann et al. |
| 5,872,422 | A | | 2/1999 | Xu et al. |
| 5,925,415 | A | | 7/1999 | Fry et al. |
| 6,097,138 | A | | 8/2000 | Nakamoto |
| 6,239,547 | B1 | | 5/2001 | Uemura et al. |
| 6,265,466 | B1 | | 7/2001 | Glatkowski et al. |

(Continued)

FOREIGN PATENT DOCUMENTS

EP 0905737 A1 3/1999

(Continued)

OTHER PUBLICATIONS

L.E. Vanatta, "Quantitation of anions at parts-per-trillion levels in semiconductor pure water by means of a laboratory ion chromatograph," *Journal of Chromatography*, 739 (1996), pp. 199-205.

(Continued)

*Primary Examiner* — Elena T Lightfoot
(74) *Attorney, Agent, or Firm* — Kelly Kordzik; Matheson Keys Garsson & Kordzik PLLC

(57) ABSTRACT

Nanoparticles are coated using thick-film techniques with a catalyst to promote the growth of carbon nanotubes thereon. In one example, alumina nanoparticles are coated with a copper catalyst. Such nanoparticles can be selectively deposited onto a substrate to create a field emission cathode, which can then be utilized within field emission devices.

13 Claims, 7 Drawing Sheets

U.S. PATENT DOCUMENTS

| | | | |
|---|---|---|---|
| 6,325,909 B1 | 12/2001 | Li et al. | |
| 6,339,281 B2 | 1/2002 | Lee et al. | |
| 6,346,189 B1 * | 2/2002 | Dai et al. | 205/766 |
| 6,359,383 B1 | 3/2002 | Chuang et al. | |
| 6,380,671 B1 | 4/2002 | Lee | |
| 6,692,717 B1 * | 2/2004 | Smalley et al. | 423/445 B |
| 7,144,627 B2 * | 12/2006 | Halas et al. | 428/403 |
| 2001/0023986 A1 * | 9/2001 | Mancevski | 257/741 |
| 2001/0053344 A1 | 12/2001 | Harutyunyan et al. | |
| 2002/0006489 A1 | 1/2002 | Goth et al. | |
| 2002/0074932 A1 * | 6/2002 | Bouchard et al. | 313/495 |
| 2002/0132045 A1 * | 9/2002 | Halas et al. | 427/217 |
| 2002/0172963 A1 * | 11/2002 | Kelley et al. | 435/6 |

FOREIGN PATENT DOCUMENTS

| | | |
|---|---|---|
| EP | 0913508 A2 | 5/1999 |
| EP | 0951047 A2 | 10/1999 |
| EP | 1047097 A1 | 10/2000 |
| EP | 1061544 A1 | 12/2000 |
| EP | 1061555 A1 | 12/2000 |
| EP | 1069587 A2 | 1/2001 |
| EP | 1073090 A2 | 1/2001 |
| EP | 1102298 A1 | 5/2001 |
| EP | 1102299 A1 | 5/2001 |
| EP | 1122759 A2 | 8/2001 |
| EP | 1146541 A2 | 10/2001 |
| JP | 58-216327 | 2/1994 |
| JP | 10-050240 | 2/1998 |
| JP | 9-221309 | 6/1998 |
| JP | 10-199398 | 7/1998 |
| JP | 11-111161 | 4/1999 |
| JP | 11-135042 | 5/1999 |
| JP | 11 260244 | 9/1999 |
| JP | 11-260249 | 9/1999 |
| JP | 11-297245 | 10/1999 |
| JP | 11-329311 | 11/1999 |
| JP | 11-329312 | 11/1999 |
| WO | WO 98/21736 | 5/1998 |
| WO | WO 00/17102 | 3/2000 |
| WO | WO 00/73205 | 12/2000 |

OTHER PUBLICATIONS

T. Guo et al., "Catalytic Growth of single-walled nanotubes by laser vaporization," *Chemical Physics Letters* 243, 1995, pp. 49-54.

Dai et al., "Single-Wall Nanotubes Produced by Metal-Catalyzed Disproportionation of Carbon Monoxide," CPL, Apr. 30, 1996, pp. 1-9, (1996).

G.L. Hornyak et al., "Template Synthesis of Carbon Nanotubes," *NanoStructured Materials*, vol. 12, 1999, pp. 83-88.

K. Hernadi et al., "Catalytic synthesis of carbon nanotubes using zeolite support," *Zeolites*, Vol. 17, 1996, pp. 416-423.

K. Hernadi et al., "Fe-Catalyzed Carbon Nanotube Formation," *Carbon*, vol. 14, 1996, pp. 1249-1257.

J.F. Colomer et al., "Large-scale synthesis of single-wall carbon nanotubes by catalytic chemical vapor deposition (CCVD) method," *Chemical Physics Letters*, 317, 2000, pp. 83-89.

Kingsuk Mukhopadhyay et al., "Bulk production of quasi-aligned carbon nanotube bundles by the catalytic chemical vapour deposition (CCVD) method," *Chemical Physics Letters*, 303 1999, pp. 117-124.

J. F. Colomer et al., "Synthesis of single-wall carbon nanotubes by catalytic decomposition of hydrocarbons," *Chem. Commun.*, 1999, pp. 1343-1344.

Masako Yudasaka et al., "Specific conditions for Ni catalyzed carbon nanotube growth by chemical vapor deposition," *Appl. Phys. Lett.*, vol. 67, No. 17, Oct. 23, 1995, pp. 2477-2479.

Ming Su et al., "A scalable CVD method for the synthesis of single-walled carbon nanotubes with high catalyst productivity," *Chemical Physics Letters*, 322, 2000, pp. 321-326.

Bingbing Liu et al., "Synthesis and characterization of single-walled nanotubes produced with Ce/Ni as catalysts," *Chemical Physical Letters*, 320, 2000, pp. 365-372.

E. Flahaut et al., "Synthesis of single-walled carbon nanotube-Co-MgO composite powders and extraction of the nanotubes," *J. Mater. Chem.*, 10, 2000, pp. 249-252.

B. Kitiyanan et al., "Controlled production of single-wall carbon nanotubes by catalytic decomposition of CO on bimetallic Co-Mo catalysts," *Chemical Physics Letters*, 317, 2000, pp. 497-503.

E. Flahaut et al., "Synthesis of single-walled carbon nanotubes using binary (Fe, Co, Ni) alloy nanoparticles prepared in situ by the reduction of oxide," *Chemical Physics Letters*, 300, 1999, pp. 236-242.

V. Brotons, "Catalytic influence of bimetallic phases for the synthesis of single-walled carbon nanotubes," *Journal of Molecular Catalyst A: Chemical*, 116, 1997, pp. 397-403.

Hongjie Dai, et al., "Single-wall nanotubes produced by metal-catalyzed disproportionation of carbon monoxide," *Chemical Physics Letters*, 260, 1996, pp. 471-475.

Supapan Seraphin et al., "Single-walled carbon nanotubes produced at high yield by mixed catalysts," *Appl. Phys. Lett.*, vol. 64, No. 16, Apr. 18, 1994, pp. 2087-2089.

M. Yudasaka et al., "Mechanism of the Effect of NiCo, Ni and Co Catalysts on the Yield of Single-Wall Carbon Nanotubes Formed by Pulsed Nd:YAG Laser Ablation," *J. Phys. Chem. B*, vol. 103, No. 30, 1999, pp. 6224-6229.

Randall L. Vander Wal et al., "Flame Synthesis of Metal-Catalyzed Single-Wall Carbon Nanotubes," *J. Phys. Chem. A*, 104, 2000, pp. 7209-7217.

Nathan R. Franklin et al., "An Enhanced CVD Approach to Extensive Nanotube Networks with Directionality," *Adv. Mater.*, vol. 12, No. 12, 2000, pp. 890-894.

J. Kong et al., "Synthesis, integration, and electrical properties of individual single-walled carbon nanotubes," *Applied Physics A*, 69, 1999, pp. 305-308.

A. Fonseca et al., "Synthesis of single- and multi-wall carbon nanotubes over supported catalysts," *Applied Physics A*, 67, 1998, pp. 11-22.

Sumio Iijima et al., "Single-shell carbon nanotubes of 1-nm diameter," *Nature*, vol. 363, Jun. 17, 1993, pp. 603-605.

W.Z. Li et al., "Large-Scale Synthesis of Aligned Carbon Nanotubes," *Science*, vol. 274, Dec. 6, 1996, pp. 1701-1703.

Jean-Christophe Charlier et al., "Microscopic Growth Mechanisms for Carbon Nanotubes," *Science*, vol. 275, Jan. 31, 1997, pp. 646-649.

Ting Guo et al., "Self-Assembly of Tubular Fullerenes," *Phys. Chem.*, vol. 99, No. 27, 1995, pp. 10694-10697.

Ting Guo et al., "Production of Single-Walled Carbon Nanotubes Via Laser Vaporization Technique," *Electrochemical Society Proceedings*, vol. 95-10, pp. 636-647, (1995).

Andreas Thess et al., "Crystalline Ropes of Metallic Carbon Nanotubes," *Science*, vol. 271, Jul. 26, 1996, pp. 483-487.

Jason H. Hafner et al., "Catalytic growth of single-wall carbon nanotubes from metal particles," *Chemical Physics Letters*, 296, 1996, pp. 195-202.

M. Takizawa et al., "Change of tube diameter distribution of single-wall carbon nanotubes induced by changing the bimetallic ratio of Ni and Y catalysts," *Chemical Physics Letters*, 326, 2000, pp. 351-357.

Jing Kong et al., "Synthesis of individual single-walled carbon nanotubes on patterned silicon wafers," *Nature*, vol. 395, Oct. 29, 1998, pp. 878-881.

L.F. Sun et al., "Growth of Straight Nanotubes with a Cobalt-Nickel Catalysts by Chemical Vapor Deposition," *Applied Physics Letters*, vol. 74, No. 5, Feb. 1, 1999, pp. 644-646.

B. Gan et al., "Y-Junction Carbon Nanotubes Grown by in Situ Evaporated Copper Catalyst," *Chemical Physics Letters*, 333, Jan. 5, 2001, pp. 23-28.

Alan M. Cassell et al., "Large Scale CVD Synthesis of Single-Walled Carbon Nanotubes," *J. Phys. Chem.*, Jul. 20, 1999, pp. 6484-6488.

Avetik R. Harutyunyan et al., "CVD Synthesis of Single Wall Carbon Nanotubes under "Soft" Conditions," *Nano Letters*, Jan. 22, 2002, pp. A-F.

\* cited by examiner

CATALYST FOR CARBON NANOTUBE GROWTH

CROSS REFERENCE TO RELATED APPLICATIONS

The present invention claims priority to the following:

Provisional Patent Application Ser. No. 60/314,870, entitled "PROCESS FOR PRODUCING PATTERNED CARBON NANOTUBE FILMS," filed on Aug. 24, 2001; and Provisional Patent Application Ser. No. 60/336,351, entitled "CATALYST FOR CARBON NANOTUBE GROWTH," filed on Nov. 2, 2001.

TECHNICAL FIELD

The present invention relates in general to carbon nanotubes, and in particular, to a process for growing carbon nanotubes.

BACKGROUND INFORMATION

Metal catalysts, such as nickel (Ni), cobalt (Co), iron (Fe), and their alloys, have been extensively investigated for carbon nanotube growth by chemical vapor deposition (CVD). A typical means of growing carbon nanotubes (CNTs) on the surface of a substrate is to deposit a thin film catalyst onto the surface. However, the thickness of catalyst is critical to the CVD grown CNTs in terms of their density, diameter, and length. Moreover, with Ni, Co, and Fe catalysts, it is difficult to control the diameter and density of CNTs due to their relatively high deposition rates and thickness sensitivity. On the other hand, field emission properties of CNTs are strongly dependent on their distributed density and aspect ratio. Thus, to control the growth of CNTs for a variety of applications, more types of catalyst and alloy need to be developed.

DETAILED DESCRIPTION OF THE DRAWINGS

Beside nickel, cobalt, iron and their alloys, copper (Cu) as catalyst for CNT growth has been investigated. It has been found that CNTs can be grown with copper by a CVD technique, and demonstrate very good field emission properties. The copper catalyst can be used to grow thinner CNTs to obtain a relatively high aspect ratio for field emission applications. Moreover, the lower growth rate with copper than with nickel is strongly dependent on the deposition time to provide a way for controlling the length or thickness of CNTs.

The present invention deposits a thin film catalyst using thick-film techniques. Thus, one can deposit a preferred amount of catalyst using inexpensive processes. Other means of preparing a copper thin film catalyst may be employed, such as evaporating, sputtering, and other physical vapor deposition coating techniques, but thickness sensitivity still remains so that it is relatively hard to control the growth of CNTs to meet field emission application. Therefore, copper thin film coated on small particles is used for CVD deposition.

The method uses a three-step process.

Step 1: Coating a Metal Catalyst Layer on Small Particles.

Figure 1:
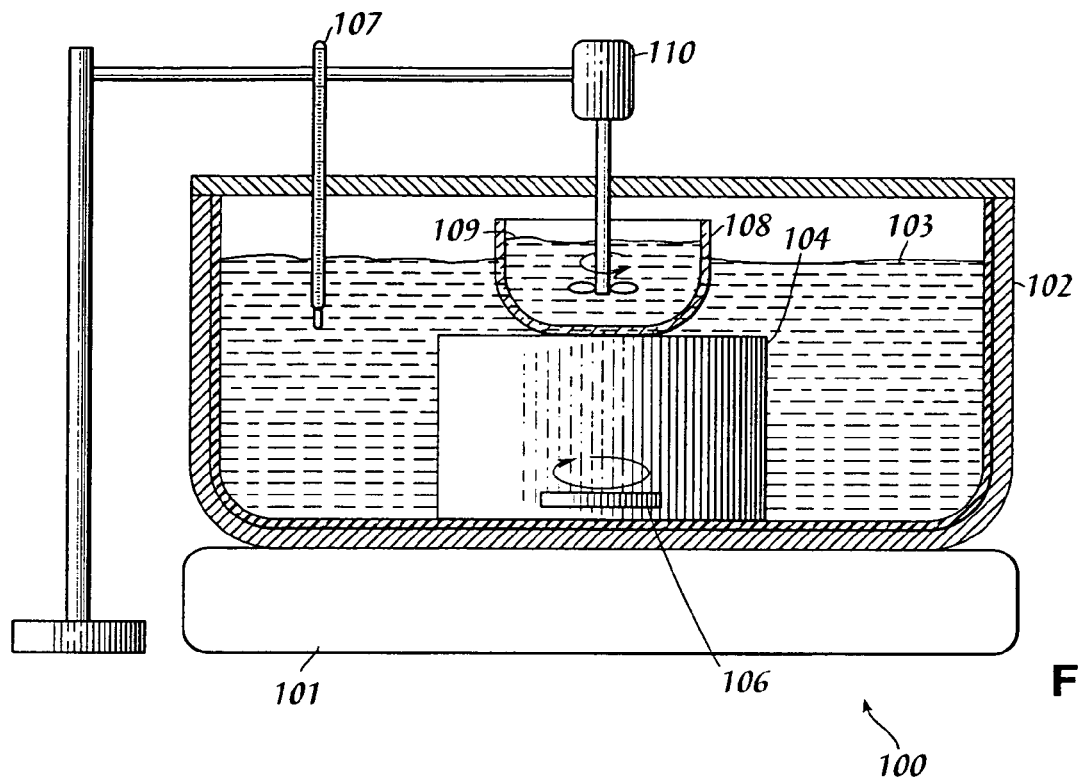
FIG. 1 illustrates a system for electroless plating.

Referring to FIG. 1, an electroless plating bath 100 is used to deposit a catalyst film onto nanoparticles. The size of the nanoparticles ranges from several nanometers to several hundred nanometers. The average size may be about 100 nanometers (about 0.1 micron). The nanoparticles may have many different shapes. One example of such nanoparticles is alumina ($Al_2O_3$), but other materials can be used for these particles. These particles can be insulating, semiconducting or conducting. The particles are compatible with the bath chemicals (acids and bases) and able to withstand the temperatures for growing carbon films (range from 500° C. to 900° C.) in hydrogen and hydrocarbon atmospheres.

The metal film (e.g., Cu, Ag, Co, Ni, Fe) on the particles that are coated with the electroless plating bath 100 is the catalyst for carbon nanotube growth. Alloys of these metals may also be used. Multiple layers of these metals may also be used. Other means of coating the particles with the metal films may be used, such as plating with electrodes, spraying, evaporating, sputtering, and other physical vapor deposition coating techniques.

The bath used to coat the particles with Cu may be an electroless plating bath for coating Cu, containing water and the following chemicals:

1. Cu salt ($CuSO4-5H_2O$).
2. Promoter to dissolve the Cu salt in the solution ($KNa_3C_4H_4O_6-4H_2O$). Concentration 80-100 grams per liter.
3. Solution to slow the reaction ($NH_4$—$H_2O$, 25%). Concentration 120 ml per liter.
4. Balancing agent (NaOH). This material is used to control the pH value of the solution. The amount of this material used is that needed to achieve a pH of 8-10 of the plating solution.

The Cu ions will be produced at room temperature at this solution. The pH of the solution is important and is to be controlled before and during the reaction. In this solution above, the PH value is 12-14. It may be necessary to add NaOH during the plating process to control the pH of the solution. The details of this plating bath solution can be varied.

After the bath is prepared, the particles are added to the solution 109. The particles are added quickly while the solution 109 is being stirred with stir and motor 110. A thermometer 107 may be used to measure the temperature of the water 103, which is contained within beaker 102 having an insulating coating. A lid 105 may be placed over beaker 102. Additionally, a heater plate with a magnetic stirring motor 101 is used with a stirring rod 106 within the holder 104 to support the beaker 108. The amount of particles (weight) is determined by the desired thickness of the Cu coating on the particles. For one liter of the above solution, 5-10 grams of the alumina powder (particles) are added to the solution 109. If more Cu is desired, a less amount of particles is added. If less metal of the particles is desired, more particles are added. The typical time of reaction is about 5-10 minutes. Longer times may not effect the results greatly. During reaction, much gas is evolved from the solution. The powder is white at the beginning and turns to black gradually. At the end of the reaction, little or no gas is evolved from the solution.

After reaction/deposition of metal, the reaction beaker 108 holding the bath and powder may be taken out of the water bath 103 and allowed to cool down to room temperature. After several hours, the particles will collect at the bottom of the beaker 108 and allow one to decant the solution 109 from the powder. Water may be added carefully to the powder in the beaker 108 to wash the powder. This may be done several times, each time being careful to not disturb the powder. Washing dilutes the concentration of the Cu bath still remaining on the powder after the reaction. The powder can be removed and dried in a furnace (not shown) at about 60° C.-100° C. Other techniques may be used to wash and recover the particles. Filters may be used or centrifuges or other common laboratory techniques to recover the particles.

The result is that the particles are coated with a thin layer of catalytic film. This film may not be necessarily uniform on each particle or uniform from particle to particle. The film thickness on a particle can range from 1 nm to 100 nm because different shapes, edges, or tips of the particles may have more surface energy and promote more deposition of the catalyst than other less reactive areas of a particle. This has several advantages:

1. It provides a wide range of catalytic activity for the metal coated particles. Some particles may be more reactive than others for a particular process (such as growing carbon nanotubes as will be described later). If the process changes, then other particles may be reactive.

2. This provides a large surface area for later reactions. The surface area of a layer of particles may be orders of magnitude larger than a well polished surface.

Step 2. Depositing the Catalytic Particles on a Substrate or Surface.

Once the particles are activated with a catalytic layer, these catalytic particles can be deposited onto a substrate for certain reactions. The catalytic particles may be used to assist in growing a carbon nanotube film on a substrate. Other applications may not require this.

To deposit the catalytic particles onto a surface, many techniques have been developed. These include electrophoresis, spraying (see FIGS. 3A-3F), painting, printing (including ink jet), and emersing (dunking) a substrate in a solution of catalytic particles. Other processes may be used for applying the particles to a substrate.

Referring to FIGS. 2 and 4A-4G, one method of depositing the particles is by using electrophoresis (EP) techniques. In this method, the particles 202 are suspended in a bath 203 containing a solvent (e.g., isopropyl alcohol) and particle surface charge promoters such as $Mg(NO_3)_2$-$6H_2O$ in order to improve the deposition rate. The concentration of the $Mg(NO_3)_2$-$6H_2O$ may be on the order of $10^{-5}$ to $10^{-2}$ moles/liter. The technique is much like a plating process, except particles 202 are coated onto the surface 206 instead of atoms of materials. EP techniques are commonly used for depositing particles of phosphor onto conducting anode faceplates used in cathode ray tubes (televisions). The substrate 206 is placed in the solution 203 opposite an electrode 207 that is also placed in the solution 203. The electrode 207 may be metal or graphite and could be a mesh or screen and not a solid sheet. The gap between the electrode 207 and the substrate 206 may be on the order of 2 cm-4 cm. The electrode 207 and substrate 206 are about the same size, but it is not necessary. The voltage between the anode 207 and substrate 206 is on the order of 400V, with the electrode 207 being positive and the substrate surface 206 being negative with respect to each other. The solution 203 may be stirred constantly, using a stirring bar 205 and magnetic agitator 204, to disperse the particles 202 in the solution 203 uniformly. After the deposition of particles 202, the substrate 206 is dried in a furnace at 50 C-100 C in air.

Figure 2:
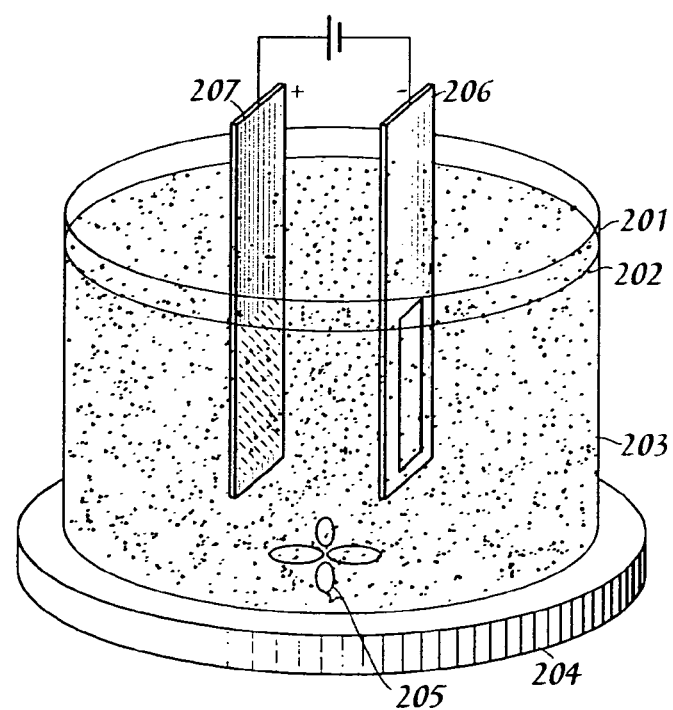
FIG. 2 illustrates a system for implementing a method in accordance with the present invention.

FIG. 4 shows this process through completion of the deposition. FIG. 4A shows the substrate 206 having a base insulating substrate 401. In FIG. 4B, a conducting layer 402 is added on top of the insulating substrate 401. The conducting layer may be made patterned. In FIG. 4C, a photoresist layer 403 is placed on top of the conducting layer 402. In FIG. 4D, the photoresist layer is patterned using typical techniques. It is this version of the substrate 206 which may be emersed in the EP solution 203, as illustrated in FIG. 2, to deposit the particles 202 thereon. In FIG. 4E, most of the particles may be deposited onto the conducting layer 402, but some may also adhere to the photoresist layer 403. After the process in FIG. 2 is completed and the substrate 206 is removed, in FIG. 4F, the photoresist layer 403 is removed, stripping the particles away that were deposited on the photoresist layer 403, and not where this layer exposed the conducting layer 402 to the electrophoretic bath 203.

Step 3: Deposition of the Carbon Nanotube Film

Figure 4A:
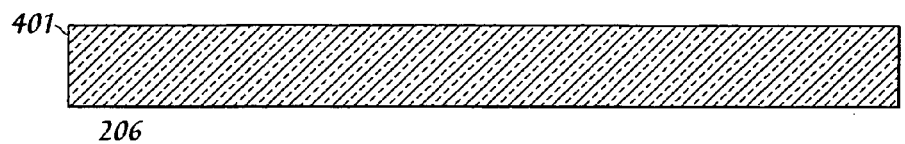
FIGS. 4A-4G illustrate a process in accordance with the present invention.
Figure 4B:
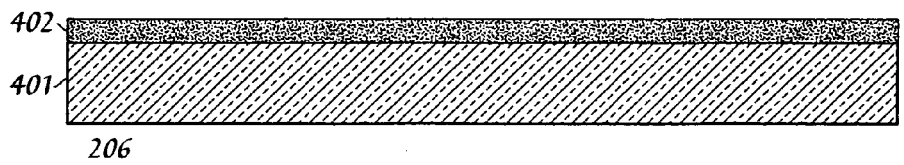
Figure 4C:
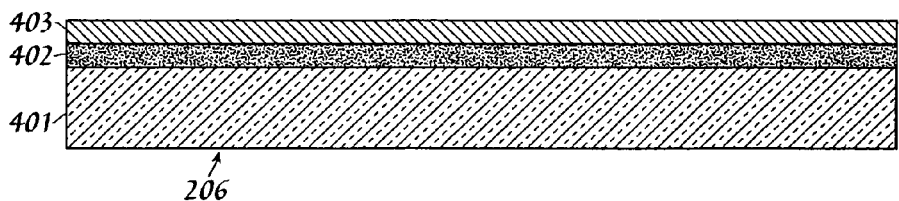
Figure 4D:
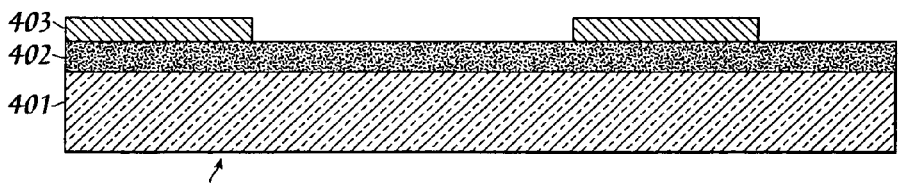
Figure 4E:
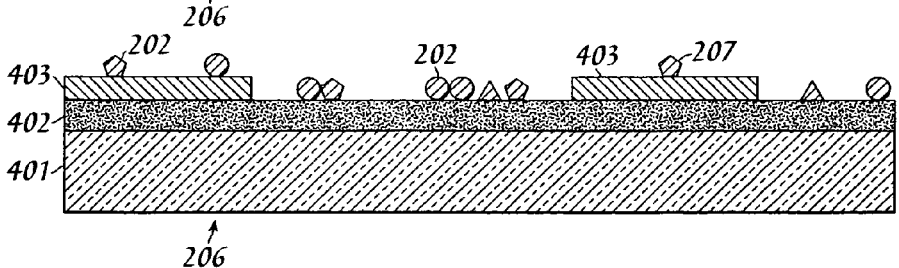
Figure 4F:
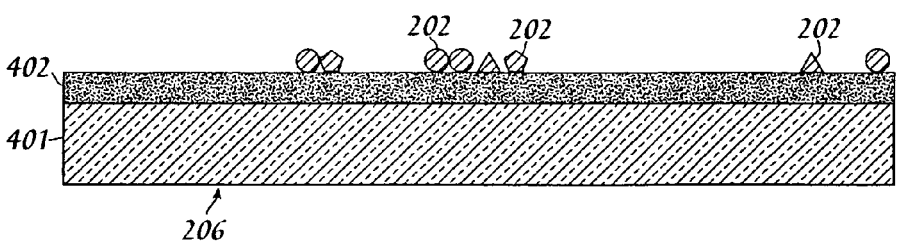
Figure 4G:
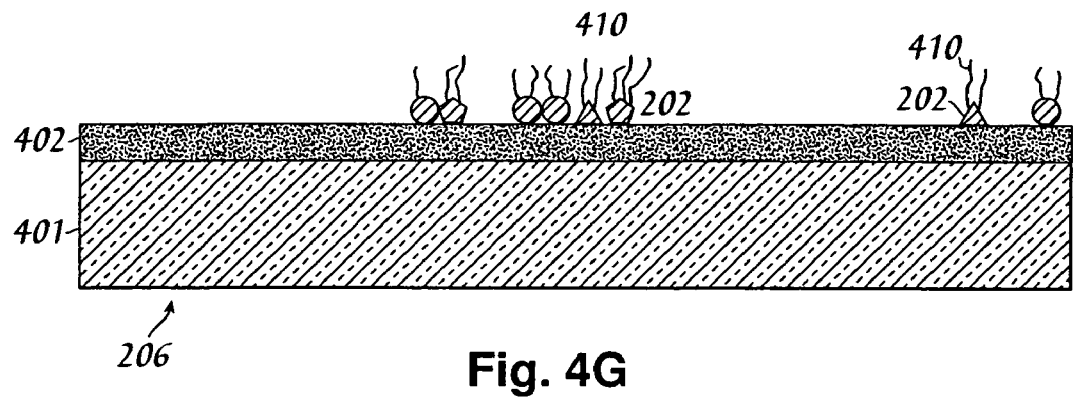

Referring to FIG. 4G, the substrate 206 with catalytic particle coating 202 is then mounted into a reactor (not shown) for depositing the carbon nanotubes 410. The reactor used may be a quartz tube furnace that operates at high temperatures and with a controlled atmosphere inside the tube. The process may be a thermal CVD process.

The substrate 206 is placed at the cold end of the reactor. After the substrate 206 is placed in the reactor, the reactor is closed off to room atmosphere and pumped down to $10^{-2}$ Torr using standard rough pumps. Then the reactor is back-filled with nitrogen gas to a pressure of 100 Torr. Nitrogen continues to flow at about 100 sccm but the pressure is regulated with a throttle valve above the pump. Then the substrate 206 is pushed into the center of the furnace where it will heat up to high temperature. After the substrate 206 is pushed into the furnace, the nitrogen gas is switched off, and hydrogen gas is switched on, also at 100 sccm flow rate. The temperature can be in a range from 450° C. to 750° C. The substrate 206 sits in this environment of flowing hydrogen for about 10-30 minutes to allow the temperature of the substrate 206 to come to equilibrium with its new environment. Then the hydrogen is switched off and acetalene ($C_2H_2$) gas flow is turned on at a flow rate of 20-50 sccm. The pressure remains at 100 Torr. The time of this period is 5-60 minutes. After this carbon growth period, the acetalene gas flow is turned off and the nitrogen gas flow is turned on at a flow rate of 100 sccm. At the same time the substrate 206 is pulled from the hot zone of the reactor to the cold zone and allowed to cool down to near room temperature. After about 10 minutes, the reactor is again evacuated and then vented to air. When the pressure reaches 1 atmosphere, the reactor is opened and the substrate 206 is removed, inspected and tested.

These parameters can be varied. Other hydrocarbon gasses can be used. Combinations of hydrocarbon gasses with each other and with hydrogen or other gasses may also be used. Carbon monoxide gas may also be used. Other forms of CVD deposition may also be used. Examples such as RF, microwave and DC plasma generation and hot wire filaments CVD are well-known methods for growing CNT films.

In summary, copper coated catalytic particles 202 are used for carbon film 410 growth. It was found that thinner CNTs with a relatively high aspect ratio were prepared. This catalyst provides a way to controllably grow CNTs by CVD. The copper coated particles also allow the use of thick film techniques to deposit the thin film catalysts on substrates for CVD carbon growth.

Substrates can be of different materials such as silicon, ceramic or glass. The catalyst can be applied in patterns as well as blanket coats on the substrates. The carbon films have then been deposited and the cathodes have emitted with good definition in the patterned areas.

Figure 3A:
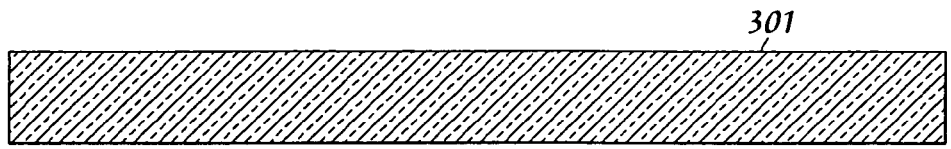
FIGS. 3A-3F illustrate a deposition process configured in accordance with the present invention.
Figure 3B:
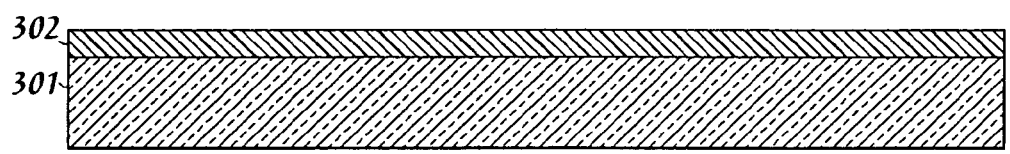
Figure 3C:
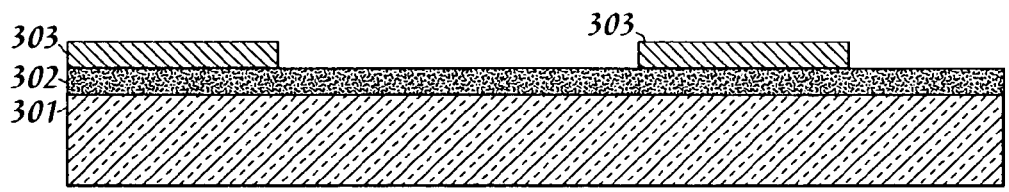
Figure 3D:
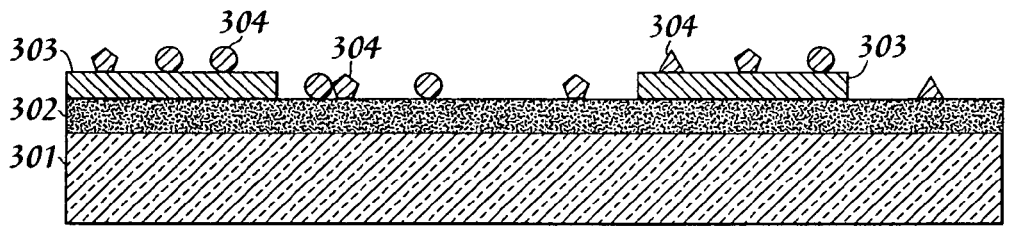
Figure 3E:
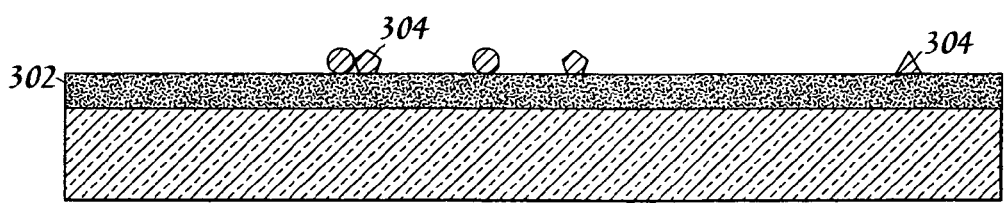
Figure 3F:
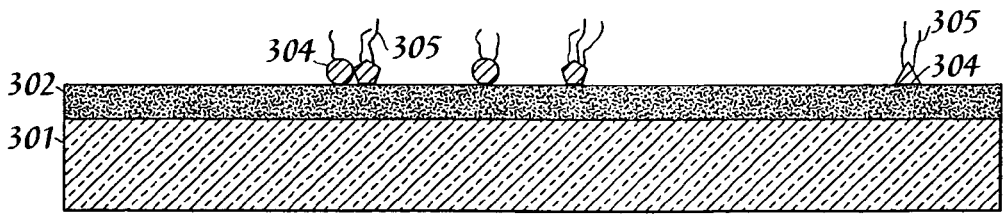

FIGS. 3A-3F illustrate an alternative method for depositing the nanoparticles onto the substrate. An insulating substrate 301 is provided in FIG. 3A. In FIG. 3B, a conducting layer 302 is added to the substrate 301. In FIG. 3C, a photoresist or hard mask layer with a predetermined pattern (e.g., holes) is added on top of the conducting layer 302. In FIG. 3D, the deposition of nanoparticles 304 is performed by some other method, such as spraying. The solvent used with particles 304 is evaporated and not shown in FIG. 3D. This solvent should not interfere with the hard mask. In FIG. 3E, the mask 303 is removed, leaving the particles 304 on the surface of the conducting layer 302 only in the areas that the mask 303 did not cover. In FIG. 3F, carbon nanotube fibers 305 are grown on the particles 304, similarly as described above.

Figure 5:
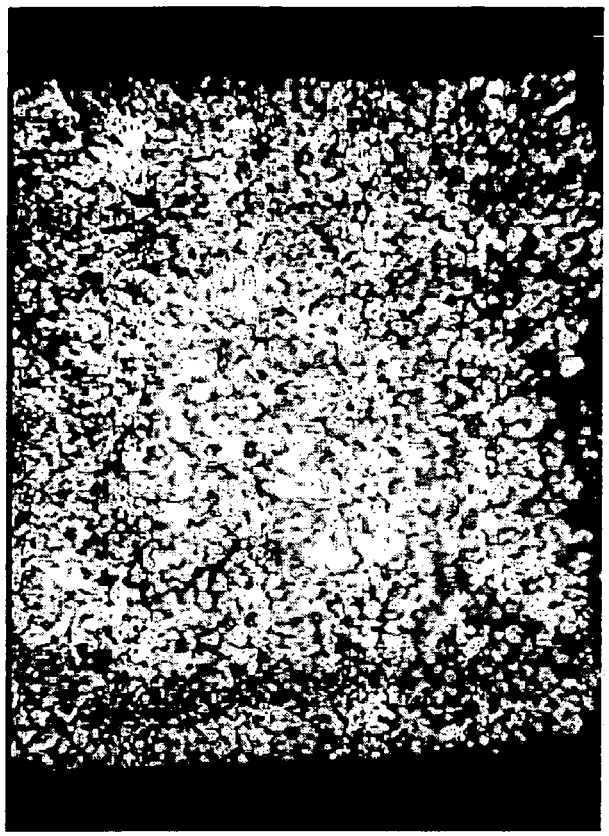
FIG. 5 illustrates images of a phosphor screen showing emission from cathodes configured in accordance with the present invention.
Figure 5:
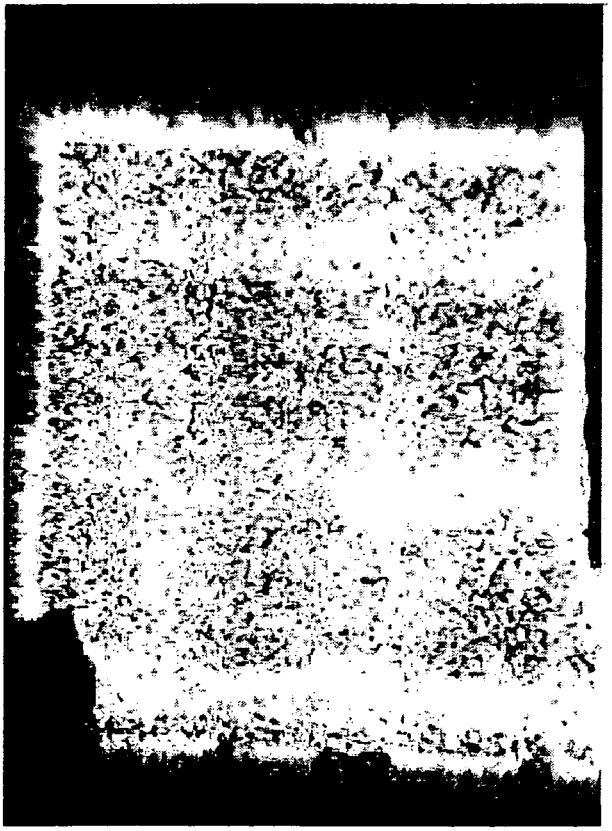

FIG. 5 illustrates images of a phosphor screen captured during testing of cathodes that are prepared with copper catalyst and copper catalyst under CVD growth conditions. The image on the left shows the cathode with copper catalyst at 3.7/μm and 15 mA/cm2. On the right, the cathode with nickel catalyst is at 5 V/μm and 6 mA/cm$^2$. The area of the cathode is about 2.5 cm$^2$.

Figure 6:
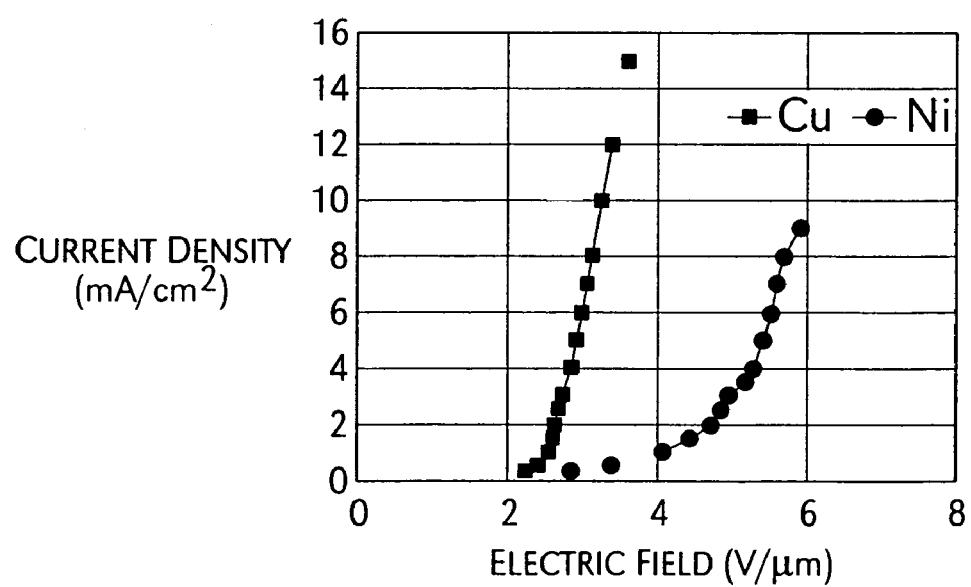
FIG. 6 illustrates I-V characteristics of a carbon nanotube cathode prepared in accordance with the present invention.

Cathodes on silicon are tested by mounting them with a phosphor screen in a diode configuration with a gap of about 0.5 mm. The test assembly is placed in a vacuum chamber and pumped to $10^{-7}$ Torr. The electrical properties of the cathode are then measured by applying a negative, pulsed voltage to the cathode and holding the anode at ground potential and measuring the current at the anode. A pulsed voltage is used to prevent damage to the phosphor screen at the high current levels. Tests on the cathodes show threshold extraction fields of about 2 V/μm, and current densities reaching near 15 mA/cm$^2$ at an electric field strength of around 3.7 V/μm. I-V curves of field emission from CNTs prepared from copper and nickel coated particles are shown in FIG. 6. The higher current at low fields from CNTs grown from copper catalyst than that of nickel is mainly attributed to a smaller diameter of CNTs resulting in a larger aspect ratio.

Figure 7:
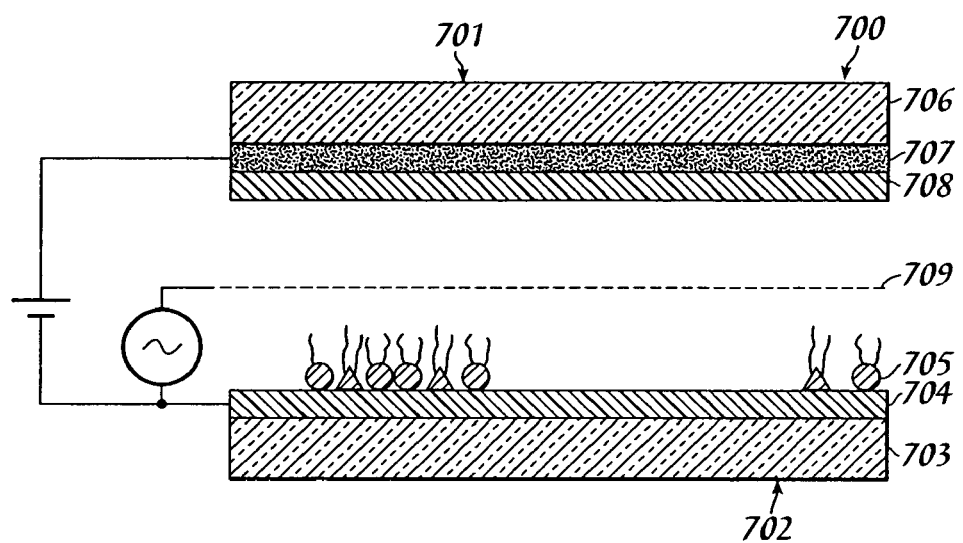
FIG. 7 illustrates a display device configured in accordance with the present invention.

Referring to FIG. 7, there is illustrated a field emission display device 700 utilizing a cathode 702 with carbon nanotubes, such as those produced in accordance with the present invention. Cathode 702 includes an insulating substrate 703 with a conducting layer 704 thereon. On the conducting layer 704 are nanoparticles 705 with carbon nanotubes grown thereon, which will emit electrons as a result of the application of the fixed and variable electric fields shown. The electrons will be emitted towards anode 700, which includes anode 701 which includes glass substrate 706 with a transparent conductor 707 and a phosphor material 708. Grid 709 may optionally be included.

Figure 8:
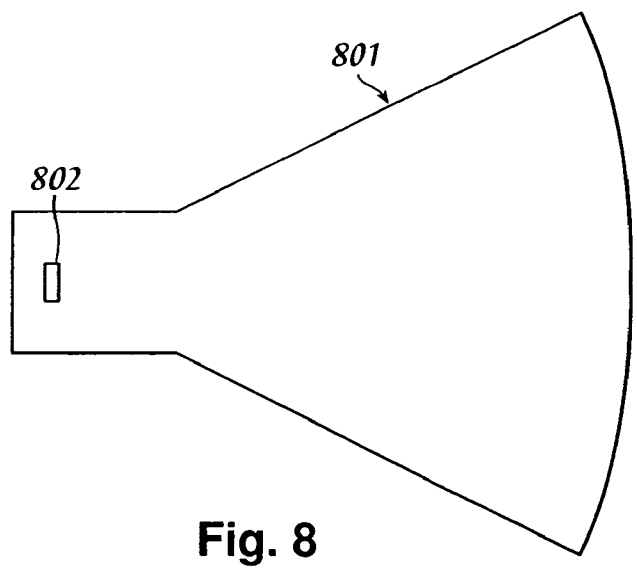
FIG. 8 illustrates a CRT configured in accordance with the present invention.

Referring to FIG. 8, the cathode produced in accordance with the present invention may be utilized as the cathode for a field emission electron gun 802 within a cathode ray tube 801. Other circuitry that might be utilized to deflect and focus the electron beam produced by the cathode 802 is not shown for the sake of simplicity.

Figure 9:
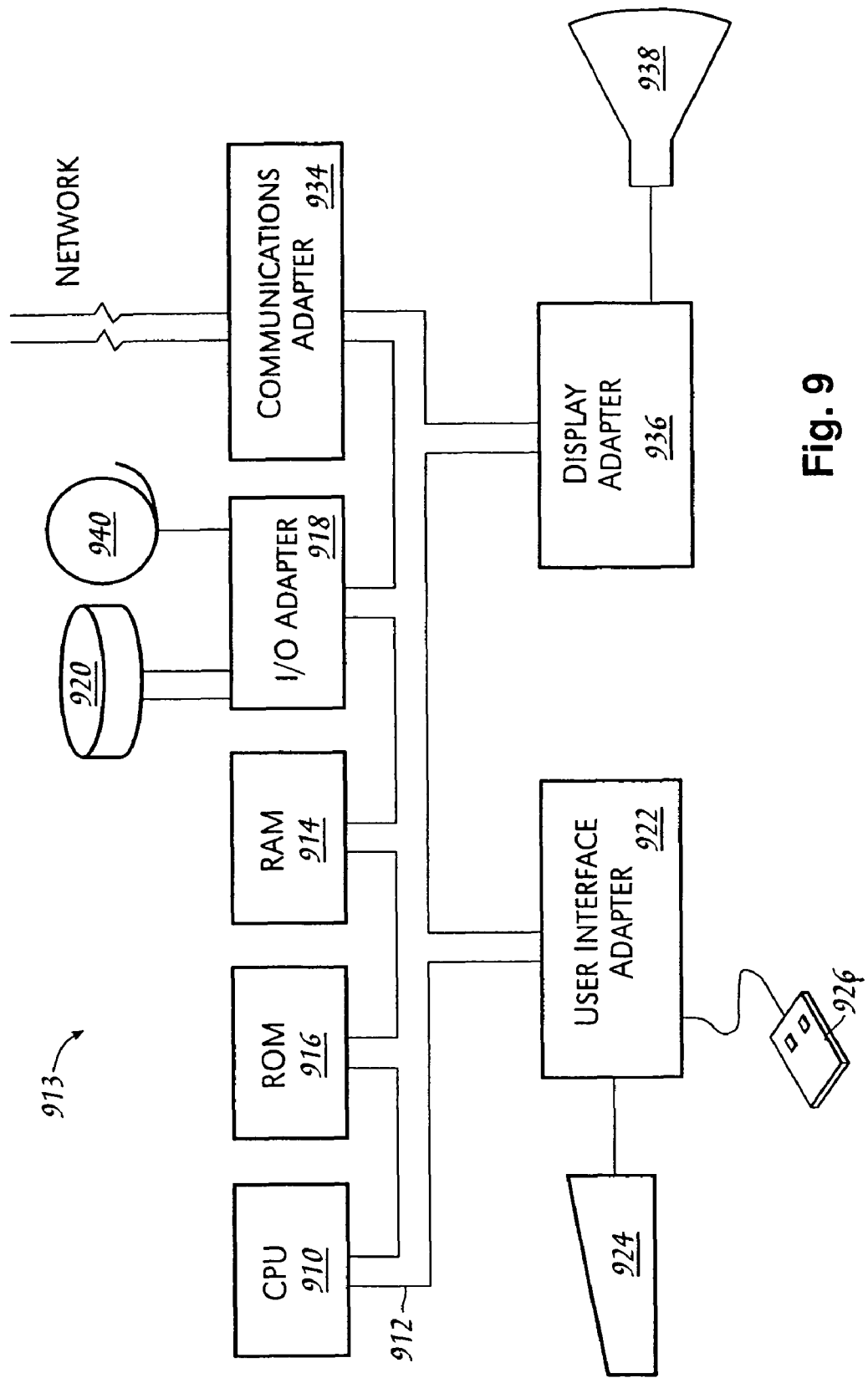
FIG. 9 illustrates a data processing system configured in accordance with the present invention.

A representative hardware environment for practicing the present invention is depicted in FIG. 9, which illustrates an exemplary hardware configuration of data processing system 913 in accordance with the subject invention having central processing unit (CPU) 910, such as a conventional microprocessor, and a number of other units interconnected via system bus 912. Data processing system 913 includes random access memory (RAM) 914, read only memory (ROM) 916, and input/output (I/O) adapter 918 for connecting peripheral devices such as disk units 920 and tape drives 940 to bus 912, user interface adapter 922 for connecting keyboard 924, mouse 926, and/or other user interface devices such as a touch screen device (not shown) to bus 912, communication adapter 934 for connecting data processing system 913 to a data processing network, and display adapter 936 for connecting bus 912 to display device 938. Display device 938 may be display 700 or CRT 801. CPU 910 may include other circuitry not shown herein, which will include circuitry commonly found within a microprocessor, e.g., execution unit, bus interface unit, arithmetic logic unit, etc.

What is claimed is:

1. A method comprising the steps of:
   coating nanoparticles with a catalyst, wherein the catalyst has a property that promotes carbon nanotube growth thereupon, wherein the coating step uses an electroless planting bath process to coat the catalyst onto the nanoparticles;
   depositing the nanoparticles coated with the catalyst onto a substrate; and
   growing carbon nanotubes on the nanoparticles.

2. The method as recited in claim 1, wherein the catalyst is a metal.

3. The method as recited in claim 2, wherein the metal is copper.

4. The method as recited in claim 2, wherein the metal is nickel.

5. The method as recited in claim 2, wherein the metal is cobalt.

6. The method as recited in claim 2, wherein the metal is iron.

7. The method as recited in claim 2, wherein the metal is silver.

8. The method as recited in claim 1, wherein the catalyst is copper.

9. The method as recited in claim 1, wherein the depositing step deposits the nanoparticles coated with the catalyst in a predetermined pattern onto the substrate.

10. The method as recited in claim 1, wherein the substrate is prepared by depositing a conducting layer onto an insulating layer.

11. The method as recited in claim 1, wherein the depositing step used an electrophoretic process to deposit the nanoparticles coated with the catalyst in a predetermined pattern.

12. The method as recited in claim 1, wherein the depositing step further comprises the steps of:
   depositing a mask layer onto the substrate, the mask layer having a predetermined pattern;
   depositing the nanoparticles coated with the catalyst onto the substrate and mask layer; and
   removing the mask layer leaving the substrate with the nanoparticles with the catalyst deposited thereon in the predetermined pattern.

13. The method as recited in claim 1, further comprising the steps of:
   positioning a screen having a phosphor thereon at a predetermined distance from the substrate, the substrate including the coated nanoparticles with carbon nanotubes grown thereon; and
   positioning circuitry in proximity to the substrate for creating an electric field to promote field emission of electrons from the carbon nanotubes grown onto the coated nanoparticles towards the screen.

\* \* \* \* \*